US011665867B2

(12) United States Patent
Murdock (10) Patent No.: US 11,665,867 B2
(45) Date of Patent: May 30, 2023

(54) THERMAL STRUCTURES FOR HEAT TRANSFER DEVICES AND SPATIAL POWER-COMBINING DEVICES

(71) Applicant: Qorvo US, Inc., Greensboro, NC (US)

(72) Inventor: Dylan Murdock, Bend, OR (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/663,878

(22) Filed: May 18, 2022

(65) Prior Publication Data

US 2022/0279676 A1  Sep. 1, 2022

Related U.S. Application Data

(63) Continuation of application No. 16/821,531, filed on Mar. 17, 2020, now Pat. No. 11,564,337.

(51) Int. Cl.
*H05K 7/20* (2006.01)
*B33Y 80/00* (2015.01)
*H05K 7/14* (2006.01)

(52) U.S. Cl.
CPC ............. *H05K 7/209* (2013.01); *B33Y 80/00* (2014.12); *H05K 7/1434* (2013.01); *H05K 7/20936* (2013.01)

(58) Field of Classification Search
CPC ....... H05K 7/2039; H05K 7/2089–209; H05K 7/20918; H05K 7/20927; H05K 7/20936;
(Continued)

(56) References Cited

U.S. PATENT DOCUMENTS 3,023,382 A  2/1962 Borghetti
4,234,854 A  11/1980 Schellenberg et al.
(Continued)

FOREIGN PATENT DOCUMENTS

EP  2469996 A2  6/2012
EP  3279597 A1  2/2018
(Continued)

OTHER PUBLICATIONS

Author Unknown, "Spatial Combining Technology: Revolutionizing the Microwave Power Amplifier," Microwave Journal, Sep. 8, 2008, http://www.microwavejournal.com/articles/print/6838-spatial-combining, CAP Wireless Inc., 7 pages.
Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.
Courtney, Patrick G. et al., "120 W Ka Band Power Amplifier Utilizing GaN MMICs and Coaxial Waveguide Spatial Power Combining," White Paper, May 2016, Qorvo, pp. 1-8.
(Continued)

*Primary Examiner* — Zachary Pape
*Assistant Examiner* — Amir A Jalali
(74) *Attorney, Agent, or Firm* — Withrow & Terranova, P.L.L.C.

(57) ABSTRACT

Thermal structures and, more particularly, improved thermal structures for heat transfer devices and spatial power-combining devices are disclosed. A spatial power-combining device may include a plurality of amplifier assemblies and each amplifier assembly includes a body structure that supports an input antenna structure, an amplifier, and an output antenna structure. One or more heat sinks may be partially or completely embedded within a body structure of such amplifier assemblies to provide effective heat dissipation paths away from amplifiers. Heat sinks may include single-phase or two-phase materials and may include prefabricated complex thermal structures. Embedded heat sinks may be provided by progressively forming unitary body structures around heat sinks by additive manufacturing techniques.

20 Claims, 6 Drawing Sheets

(58) Field of Classification Search
CPC ....... H05K 1/0201–0212; H05K 1/021; H05K 1/029; H05K 2201/06–068; H01P 1/23; H01P 1/30; H01P 1/262; H01P 3/081; H01P 5/024; H01P 5/12; H01P 5/16; H03F 3/602; B33Y 80/00

See application file for complete search history.

(56) References Cited

U.S. PATENT DOCUMENTS

| | | | |
|---|---|---|---|
| 4,424,496 A | 1/1984 | Nichols et al. | |
| 4,612,512 A | 9/1986 | Powell et al. | |
| 4,724,400 A | 2/1988 | Luettgenau | |
| 5,036,335 A | 7/1991 | Jairam | |
| 5,162,803 A | 11/1992 | Chen | |
| 5,214,394 A | 5/1993 | Wong | |
| 5,256,988 A | 10/1993 | Izadian | |
| 5,736,908 A | 4/1998 | Alexanian et al. | |
| 5,920,240 A | 7/1999 | Alexanian et al. | |
| 6,028,483 A | 2/2000 | Shealy et al. | |
| 6,037,840 A | 3/2000 | Myer | |
| 6,181,221 B1 | 1/2001 | Kich et al. | |
| 6,828,875 B2 | 12/2004 | Channabasappa et al. | |
| 7,110,165 B2 | 9/2006 | Martin et al. | |
| 7,215,220 B1* | 5/2007 | Jia ............................ | H01P 5/12 |
| | | | 333/136 |
| 7,466,203 B2 | 12/2008 | Rector | |
| 8,698,577 B2 | 4/2014 | Sherrer et al. | |
| 8,801,922 B2 | 8/2014 | Wrazel et al. | |
| 8,928,429 B2 | 1/2015 | Song et al. | |
| 9,019,036 B2 | 4/2015 | Kolias et al. | |
| 9,054,427 B2 | 6/2015 | Guy et al. | |
| 9,065,163 B1 | 6/2015 | Wu et al. | |
| 9,276,304 B2 | 3/2016 | Behan et al. | |
| 9,287,605 B2 | 3/2016 | Daughenbaugh, Jr. et al. | |
| 9,293,801 B2 | 3/2016 | Courtney et al. | |
| 9,325,074 B2 | 4/2016 | Chandler | |
| 9,547,344 B2* | 1/2017 | Han ........................ | G06F 1/203 |
| 9,917,343 B2 | 3/2018 | Chieh et al. | |
| 9,954,706 B1 | 4/2018 | Harris et al. | |
| 10,003,118 B2 | 6/2018 | Kitt | |
| 10,009,067 B2 | 6/2018 | Birk et al. | |
| 10,164,667 B1 | 12/2018 | Kitt | |
| 10,263,651 B1 | 4/2019 | Kitt | |
| 10,340,574 B2 | 7/2019 | Mohan et al. | |
| 10,454,433 B2 | 10/2019 | Kitt | |
| 2002/0118520 A1 | 8/2002 | Baker | |
| 2004/0108903 A1 | 6/2004 | Channabasappa et al. | |
| 2006/0202777 A1 | 9/2006 | Deckman et al. | |
| 2007/0229186 A1 | 10/2007 | Hacker et al. | |
| 2007/0279146 A1 | 12/2007 | Rector | |
| 2010/0065256 A1* | 3/2010 | Wilcoxon ............... | F28D 15/00 |
| | | | 165/104.31 |
| 2011/0300230 A1 | 12/2011 | Peterson et al. | |
| 2013/0003309 A1 | 1/2013 | Stella | |
| 2014/0145794 A1 | 5/2014 | Courtney et al. | |
| 2014/0145795 A1* | 5/2014 | Behan ...................... | H01P 5/12 |
| | | | 333/127 |
| 2014/0167880 A1 | 6/2014 | Daughenbaugh, Jr. et al. | |
| 2014/0347145 A1 | 11/2014 | Nakamura et al. | |
| 2015/0270817 A1 | 9/2015 | Campbell | |
| 2017/0149113 A1* | 5/2017 | Theveneau ............ | H01P 3/081 |
| 2017/0179598 A1 | 6/2017 | Kitt | |
| 2018/0187984 A1 | 7/2018 | Manzo | |
| 2018/0294539 A1 | 10/2018 | Kitt | |
| 2019/0007007 A1 | 1/2019 | Kitt | |
| 2019/0067778 A1 | 2/2019 | Mohan | |
| 2019/0067781 A1 | 2/2019 | Mohan et al. | |
| 2019/0067782 A1 | 2/2019 | Mohan et al. | |
| 2019/0067783 A1 | 2/2019 | Mohan et al. | |
| 2019/0067836 A1 | 2/2019 | Mohan | |
| 2019/0068123 A1 | 2/2019 | Mohan et al. | |
| 2019/0068140 A1* | 2/2019 | Mohan ..................... | H01P 1/22 |
| 2019/0068141 A1 | 2/2019 | Yoon et al. | |
| 2019/0081453 A1 | 3/2019 | Meehan et al. | |
| 2019/0140356 A1 | 5/2019 | Mohan | |
| 2019/0312327 A1* | 10/2019 | Kitt ........................... | H01P 3/06 |
| 2020/0041209 A1 | 2/2020 | Valenti et al. | |
| 2020/0041210 A1 | 2/2020 | Valenti et al. | |
| 2020/0162046 A1* | 5/2020 | Bojkov .................. | H03F 3/602 |
| 2020/0185803 A1 | 6/2020 | Mohan et al. | |
| 2020/0274506 A1 | 8/2020 | Yoon et al. | |
| 2021/0297048 A1 | 9/2021 | Yoon et al. | |
| 2021/0298207 A1 | 9/2021 | Murdock | |

FOREIGN PATENT DOCUMENTS

| | | |
|---|---|---|
| EP | 3454370 A1 | 3/2019 |
| FR | 3040242 A1 | 2/2017 |
| WO | 2017214357 A2 | 12/2017 |
| WO | 2018134495 A1 | 7/2018 |

OTHER PUBLICATIONS

Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.

Leggieri, Alberto et al., "The Squarax Spatial Power Combiner," Progress In Electromagnetics Research C, vol. 45, Oct. 2013, EMW Publishing, pp. 43-55.

Ortiz, Sean C., "High Power Spatial Combiners: Tile and Tray Approaches," Dissertation, North Carolina State University, Electrical Engineering, Nov. 2001, 194 pages.

Notice of Allowance for U.S. Appl. No. 15/290,749, dated Feb. 16, 2018, 9 pages.

Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.

Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.

Fathy, A., et al., "A Simplified Approach for Radial Power Combiners," IEEE Transactions on Microwave Theory and Techniques, vol. 54, No. 1, Jan. 2006, pp. 247-255.

Gharehkand, F., "Design of a 16 Way Radial Microwave Power Divider/Combiner with Rectangular Waveguide Output and Coaxial Inputs," International Journal of Electronics and Communications (AEU), vol. 68, 2014, pp. 422-428.

Tribak, A., et al., "Ultra-Broadband High Efficiency Mode Converter," Progress in Electromagnetics Research C, vol. 36, 2013, pp. 145-158.

Montgomery, R., et al., "Solid-State PAs Battle TWTAs for ECM Systems," Microwave Journal, Jun. 2017 Supplement, Jun. 14, 2017, 3 pages.

Möttönen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.

Non-Final Office Action for U.S. Appl. No. 15/637,472, dated Aug. 10, 2018, 8 pages.

Notice of Allowance for U.S. Appl. No. 15/927,565, dated Aug. 8, 2018, 8 pages.

Author Unknown, "Interpack 2005: An assessment for PMMI members," 2005, PMMI, 32 pages.

Caturla, F., et al., "Electroless Plating of Graphite with Copper and Nickel," Journal of the Electrochemical Soceity, vol. 142, Issue 12, Dec. 1995, The Electrochemical Society, Inc., pp. 4084-4090.

Fitzhugh, William, et al., "Modulation of Ionic Current Limitations by Doping Graphite Anodes," Journal of Electrochemical Society, vol. 165, Issue 10, Jul. 2018, The Electrochemical Society, 6 pages.

Larkins, Grover, et al., "Evidence of Superconductivity in Doped Graphite and Graphene," Superconductor Science and Technology, vol. 29, Issue 1, Dec. 2015, IOP Publishing Ltd, 18 pages.

Glenis, S., et al., "Sulfur doped graphite prepared via arc discharge of carbon rods in the presence of thiopenes," Journal of Applied Physics, vol. 86, Issue 8, Oct. 1999, American Institute of Physics, pp. 4464-4466.

(56) References Cited

OTHER PUBLICATIONS

Scheike, T., et al., "Can doping graphite trigger room temperature superconductivity: Evidence for granular high-temperature superconductivity in water-treated graphite powder," Advanced Materials, vol. 24, Issue 43, Sep. 2012, 19 pages.
Smalc, Martin, et al., "Thermal Performance of Natural Graphite Heat Spreaders," Proceedings of IPACK2005, Jul. 17-22, San Francisco, California, American Society of Mechanical Engineers, 11 pages.
Notice of Allowance for U.S. Appl. No. 15/637,472, dated Mar. 12, 2019, 7 pages.
Non-Final Office Action for U.S. Appl. No. 15/846,840, dated Mar. 21, 2019, 4 pages.
Notice of Allowance for U.S. Appl. No. 15/845,225, dated Jan. 10, 2019, 7 pages.
Notice of Allowance for U.S. Appl. No. 16/166,548, dated Nov. 29, 2018, 8 pages.
Non-Final Office Action for U.S. Appl. No. 15/933,783, dated May 1, 2019, 8 pages.
Non-Final Office Action for U.S. Appl. No. 16/042,351, dated Jul. 5, 2019, 5 pages.
Notice of Allowance for U.S. Appl. No. 15/846,840, dated Jul. 5, 2019, 7 pages.
Non-Final Office Action for U.S. Appl. No. 15/981,535, dated Jul. 8, 2019, 5 pages.
Non-Final Office Action for U.S. Appl. No. 16/005,794, dated Oct. 7, 2019, 11 pages.
Notice of Allowance for U.S. Appl. No. 16/005,794, dated Jan. 9, 2020, 7 pages.
Corrected Notice of Allowability and Examiner-Initiated Interview Summary for U.S. Appl. No. 16/005,794, dated May 26, 2020, 6 pages.
Non-Final Office Action for U.S. Appl. No. 16/032,252, dated Dec. 27, 2019, 5 pages.
Notice of Allowance for U.S. Appl. No. 16/032,252, dated Jun. 1, 2020, 7 pages.
Notice of Allowance for U.S. Appl. No. 16/042,351, dated Nov. 18, 2019, 7 pages.
Non-Final Office Action for U.S. Appl. No. 16/008,586, dated Oct. 24, 2019, 10 pages.
Notice of Allowance for U.S. Appl. No. 16/008,586, dated Feb. 4, 2020, 8 pages.
Corrected Notice of Allowance and Examiner-Initiated Interview Summary for U.S. Appl. No. 15/846,840, dated Dec. 12, 2019, 6 pages.
Corrected Notice of Allowance and Applicant-Initiated Interview Summary for U.S. Appl. No. 15/846,840, dated Dec. 31, 2019, 6 pages.
Notice of Allowance for U.S. Appl. No. 15/981,535, dated Dec. 31, 2019, 7 pages.
Non-Final Office Action for U.S. Appl. No. 15/981,516, dated Jul. 17, 2019, 5 pages.
Notice of Allowance for U.S. Appl. No. 15/981,516, dated Jan. 15, 2020, 7 pages.
Non-Final Office Action for U.S. Appl. No. 15/933,821, dated Jul. 11, 2019, 7 pages.
Notice of Allowance for U.S. Appl. No. 15/933,821, dated Jan. 15, 2020, 7 pages.
Non-Final Office Action for U.S. Appl. No. 16/039,435, dated Jan. 7, 2020, 5 pages.
Notice of Allowance for U.S. Appl. No. 16/039,435, dated Jun. 17, 2020, 8 pages.
Notice of Allowance for U.S. Appl. No. 16/214,234, dated May 15, 2020, 8 pages.
Non-Final Office Action for U.S. Appl. No. 16/288,735, dated May 26, 2020, 9 pages.
Advisory Action, Examiner-Initiated Interview Summary, and AFCP 2.0 Decision for U.S. Appl. No. 16/191,541, dated May 21, 2020, 5 pages.
Final Office Action for U.S. Appl. No. 16/191,541, dated Mar. 31, 2020, 8 pages.
Non-Final Office Action for U.S. Appl. No. 16/191,541, dated Dec. 9, 2019, 7 pages.
Espera Jr., A.H. et al., "3D-printing and advanced manufacturing for electronics," Progress in Additive Manufacturing, Feb. 4, 2019, Springer, 24 pages.
Glasschroeder, J. et al., "Powder-bed-based 3D-printing of function integrated parts," Rapid Prototyping Journal, vol. 21, Issue 2, Emerald Group Publishing Limited, pp. 207-215.
Leigh, S.J. et al., "A Simple, Low-Cost Conductive Composite Material for 3D Printing of Electronic Sensors," PLoS ONE, vol. 7, Issue 11, Nov. 2012, 6 pages.
Sames, W.J. et al., "The Metallurgy and Processing Science of Metal Additive Manufacturing," 2016, available at https://www.osti.gov/servlets/purl/1267051, 76 pages.
Notice of Allowance for U.S. Appl. No. 16/288,735, dated Oct. 29, 2020, 7 pages.
Non-Final Office Action for U.S. Appl. No. 16/288,735, dated May 3, 2021, 8 pages.
Non-Final Office Action for U.S. Appl. No. 16/288,761, dated Apr. 1, 2021, 8 pages.
Examiner-Initiated Interview Summary for U.S. Appl. No. 16/288,761, dated Jun. 18, 2021, 2 pages.
Notice of Allowance for U.S. Appl. No. 16/288,761, dated Jun. 29, 2021, 7 pages.
Notice of Allowance for U.S. Appl. No. 16/191,541, dated Jul. 9, 2020, 7 pages.
Non-Final Office Action for U.S. Appl. No. 16/284,214, dated Aug. 20, 2020, 5 pages.
Notice of Allowance for U.S. Appl. No. 16/284,214, dated Jan. 6, 2021, 7 pages.
Non-Final Office Action for U.S. Appl. No. 16/928,092, dated Oct. 27, 2021, 5 pages.
Notice of Allowance for U.S. Appl. No. 16/928,092, dated Mar. 30, 2022, 7 pages.
Notice of Allowance for U.S. Appl. No. 16/288,735, dated Sep. 29, 2021, 8 pages.
Non-Final Office Action for U.S. Appl. No. 16/820,880, dated Nov. 19, 2021, 10 pages.
Notice of Allowance for U.S. Appl. No. 16/820,880, dated Mar. 2, 2022, 8 pages.
Non-Final Office Action for U.S. Appl. No. 16/821,531, dated Nov. 10, 2021, 15 pages.
Notice of Allowance for U.S. Appl. No. 16/821,531, dated Mar. 10, 2022, 8 pages.
Non-Final Office Action for U.S. Appl. No. 16/821,531, dated Jun. 16, 2022, 15 pages.
Notice of Allowance for U.S. Appl. No. 16/821,531, dated Sep. 20, 2022, 8 pages.
Notice of Allowance for U.S. Appl. No. 17/245,114, dated Nov. 23, 2022, 10 pages.

* cited by examiner

THERMAL STRUCTURES FOR HEAT TRANSFER DEVICES AND SPATIAL POWER-COMBINING DEVICES

RELATED APPLICATIONS

This application is a continuation of U.S. patent application Ser. No. 16/821,531, filed Mar. 17, 2020, the disclosure of which is hereby incorporated herein by reference in its entirety.

FIELD OF THE DISCLOSURE

The disclosure relates generally to thermal structures and, more particularly, to improved thermal structures for heat transfer devices and spatial power-combining devices.

BACKGROUND

Spatial power-combining devices are used for broadband radio frequency power amplification in commercial and defense communications, radar, electronic warfare, satellite, and various other communication systems. Spatial power-combining techniques are implemented by combining broadband signals from a number of amplifiers to provide output powers with high efficiencies and operating frequencies. One example of a spatial power-combining device utilizes a plurality of solid-state amplifier assemblies that form a coaxial waveguide to amplify an electromagnetic signal. Each amplifier assembly may include an input antenna structure, an amplifier, and an output antenna structure. When the amplifier assemblies are combined to form the coaxial waveguide, the input antenna structures may form an input antipodal antenna array, and the output antenna structures may form an output antipodal antenna array.

In operation, an electromagnetic signal is passed through an input port to an input coaxial waveguide section of the spatial power-combining device. The input coaxial waveguide section distributes the electromagnetic signal to be split across the input antipodal antenna array. The amplifiers receive the split signals and in turn transmit amplified split signals across the output antipodal antenna array. The output antipodal antenna array and an output coaxial waveguide section combine the amplified split signals to form an amplified electromagnetic signal that is passed to an output port of the spatial power-combining device.

Antenna structures for spatial power-combining devices typically include an antenna signal conductor and an antenna ground conductor deposited on opposite sides of a substrate, such as a printed circuit board. The size of the antenna structures are related to an operating frequency of the spatial power-combining device. For example, the size of the input antenna structure is related to the frequency of energy that can be efficiently received, and the size of the output antenna structure is related to the frequency of energy that can be efficiently transmitted. Overall sizes of spatial power-combining devices typically scale larger or smaller depending on desired operating frequency ranges. Additional size and structural considerations for spatial power-combining devices involve providing good thermal management for heat generated during amplification.

The art continues to seek improved heat transfer devices and spatial power-combining devices having improved mechanical properties and good operating performance while being capable of overcoming challenges associated with conventional devices.

SUMMARY

Aspects disclosed herein relate to thermal structures and, more particularly, to improved thermal structures for heat transfer devices and spatial power-combining devices. A spatial power-combining device may include a plurality of amplifier assemblies and each amplifier assembly includes a body structure that supports an input antenna structure, an amplifier, and an output antenna structure. According to embodiments disclosed herein, one or more heat sinks may be partially or completely embedded within a body structure of such amplifier assemblies to provide effective heat dissipation paths away from amplifiers. Heat sinks may include single-phase or two-phase materials and may include prefabricated complex thermal structures. Embedded heat sinks may be provided by progressively forming unitary body structures around heat sinks by additive manufacturing techniques.

In one aspect, a spatial power-combining device for modifying a signal comprising a plurality of amplifier assemblies, wherein each amplifier assembly of the plurality of amplifier assemblies comprises: an amplifier; a body structure that is configured to support the amplifier; and a heat sink that is entirely embedded within the body structure. In certain embodiments, the heat sink is provided closer to a surface of the body structure that supports the amplifier than an opposing surface of the body structure. In certain embodiments, the heat sink extends within the body structure in a lateral direction relative to a surface of the body structure that supports the amplifier. In certain embodiments, the heat sink extends in the lateral direction a distance that is greater than one or more peripheral edges of the amplifier. In certain embodiments, the heat sink comprises a material having a higher thermal conductivity than the body structure. In certain embodiments, the heat sink comprises one or more of a metal, a ceramic, and a polymer. In certain embodiments, the heat sink comprises one or more of a heat pipe, a thermal ground plane, and a phase change material. In certain embodiments, the heat sink forms two parallel opposing faces within the body structure. In certain embodiments, the heat sink forms a cross-sectional wedge shape. In certain embodiments, the body structure is formed by additive manufacturing.

In another aspect, a spatial power-combining device for modifying a signal comprising a plurality of amplifier assemblies, wherein each amplifier assembly of the plurality of amplifier assemblies comprises: an amplifier; a body structure that is configured to support the amplifier; and a heat sink that is partially embedded within the body structure, the heat sink extending in a lateral direction relative to a surface of the body structure that supports the amplifier a distance that is greater than one or more peripheral edges of the amplifier. In certain embodiments, the heat sink is provided closer to the surface of the body structure that supports the amplifier than an opposing surface of the body structure. In certain embodiments, the heat sink extends in the lateral direction to an outer surface of the body structure such that a peripheral edge of the heat sink is exposed at the outer surface. In certain embodiments, at least a portion of the heat sink is exposed at the surface of the body structure that supports the amplifier. In certain embodiments, the heat sink comprises a material having a higher thermal conductivity than the body structure. In certain embodiments, the heat sink comprises one or more of a metal, a ceramic, and a polymer. In certain embodiments, the heat sink comprises one or more of a heat pipe, a thermal ground plane, and a phase change material. In certain embodiments, the heat sink forms two parallel opposing faces within the body structure. In certain embodiments, the heat sink forms a cross-sectional wedge shape. In certain embodiments, the body structure is formed by additive manufacturing.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Common elements between figures may be shown herein with common element numbers and may not be subsequently re-described.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed herein relate to thermal structures and, more particularly, to improved thermal structures for heat transfer devices and spatial power-combining devices. A spatial power-combining device includes a plurality of amplifier assemblies and each amplifier assembly includes a body structure that supports an input antenna structure, an amplifier, and an output antenna structure. According to embodiments disclosed herein, one or more heat sinks may be partially or completely embedded within a body structure of such amplifier assemblies to provide effective heat dissipation paths away from amplifiers. Heat sinks may include single-phase or two-phase materials and may include prefabricated complex thermal structures. Embedded heat sinks may be provided by progressively forming unitary body structures around heat sinks by additive manufacturing techniques.

Figure 1:
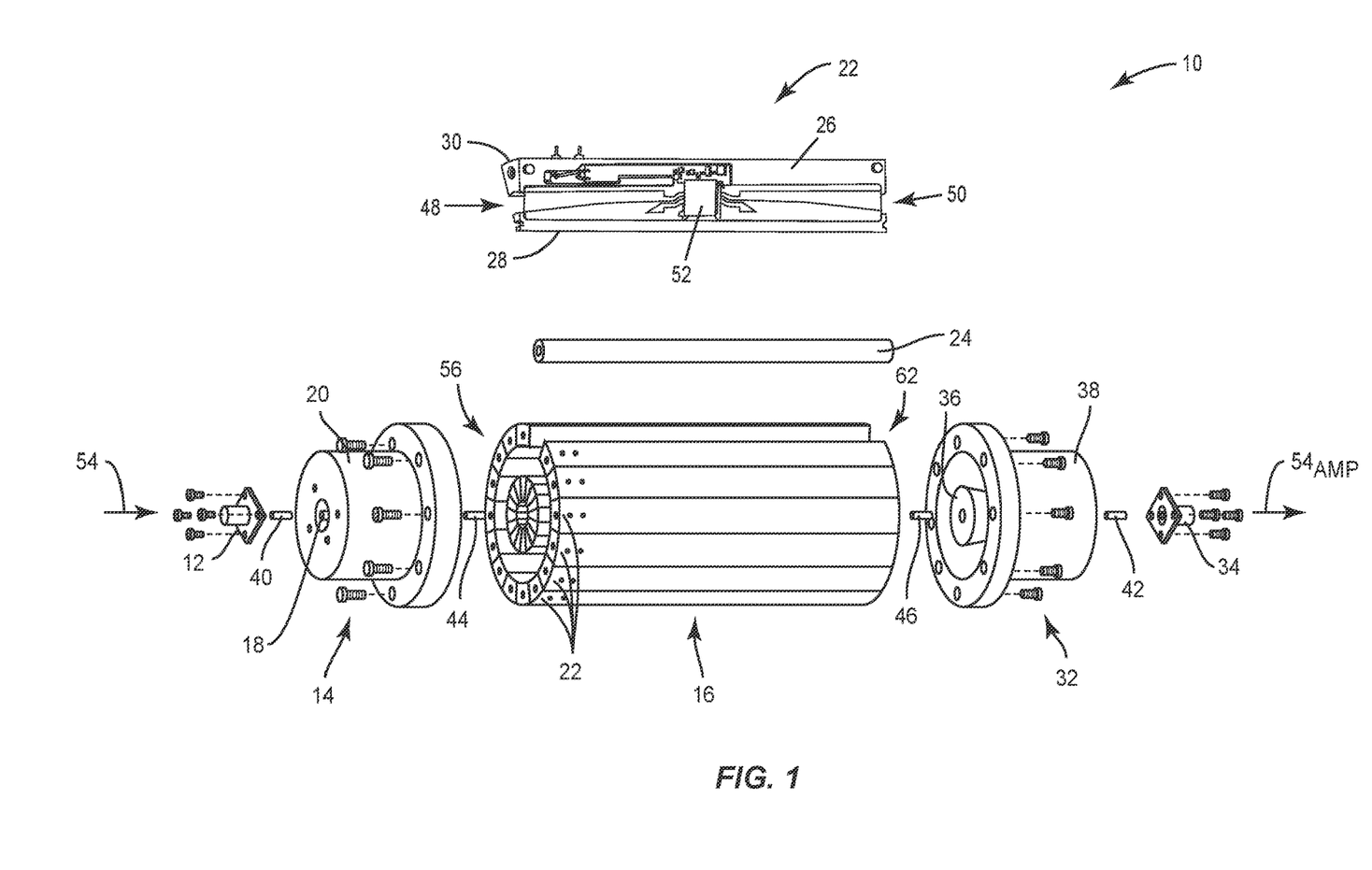
FIG. 1 is a partially-exploded perspective view of a spatial power-combining device.

FIG. 1 is a partially-exploded perspective view of a spatial power-combining device 10. The spatial power-combining device 10 comprises an input port 12 and an input coaxial waveguide section 14. The input coaxial waveguide section 14 provides a broadband transition from the input port 12 to a center waveguide section 16. Electrically, the input coaxial waveguide section 14 provides broadband impedance matching from an impedance $Z_{p1}$ of the input port 12 to an impedance $Z_c$ of the center waveguide section 16. The input coaxial waveguide section 14 includes an inner conductor 18 and an outer conductor 20 that radially surrounds the inner conductor 18, thereby forming an opening therebetween. Outer surfaces of the inner conductor 18 and an inner surface of the outer conductor 20 have gradually changed profiles configured to minimize the impedance mismatch from the input port 12 to the center waveguide section 16.

The center waveguide section 16 comprises a plurality of amplifier assemblies 22 arranged radially around a center axis of the spatial power-combining device 10. In certain embodiments, a center post 24 is provided at the center axis for mechanical support and the plurality of amplifier assemblies 22 may be positioned circumferentially around the center post 24. In other embodiments, the center post 24 may be omitted. In FIG. 1, the center post 24 is illustrated in an exploded manner. Each amplifier assembly 22 comprises a body structure 26 having a predetermined wedge-shaped cross-section, an inner surface 28, and an arcuate outer surface 30. When the amplifier assemblies 22 are collectively assembled radially about the center axis, they form the center waveguide section 16 with a generally cylindrical shape; however, other shapes are possible, such as rectangular, oval, or other geometric shapes.

The spatial power-combining device 10 also comprises an output coaxial waveguide section 32 and an output port 34. The input port 12 and the output port 34 may comprise any of a field-replaceable Subminiature A (SMA) connector, a super SMA connector, a type N connector, a type K connector, a WR28 connector, other coaxial to waveguide transition connectors, or any other suitable coaxial or waveguide connectors. In embodiments where the operating frequency range includes a frequency of at least 18 gigahertz (GHz), the output port 34 may comprise a waveguide output port, such as a WR28 or other sized waveguide. The output coaxial waveguide section 32 provides a broadband transition from the center waveguide section 16 to the output port 34. Electrically, the output coaxial waveguide section 32 provides broadband impedance matching from the impedance $Z_c$ of the center waveguide section 16 to an impedance $Z_{p2}$ of the output port 34. The output coaxial waveguide section 32 includes an inner conductor 36 and an outer conductor 38 that radially surrounds the inner conductor 36, thereby forming an opening therebetween. Outer surfaces of the inner conductor 36 and an inner surface of the outer conductor 38 have gradually changed profiles configured to minimize the impedance mismatch from the output port 34 to the center waveguide section 16. In certain embodiments, a pin 40 connects between the input port 12 and the input coaxial waveguide section 14, and a pin 42 connects between the output port 34 and the output coaxial waveguide section 32. In certain embodiments, the center post 24 connects with the inner conductors 18, 36 by way of screws 44, 46 on opposite ends of the center post 24. The center post 24 is provided for simplifying mechanical connections, may have other than a cylindrical shape, and may be omitted altogether.

Each amplifier assembly 22 comprises an input antenna structure 48 and an output antenna structure 50, both of which are coupled to an amplifier 52. In some embodiments, the amplifier 52 comprises a monolithic microwave integrated circuit (MMIC) amplifier. A MMIC may be a solid-state gallium nitride (GaN)-based MMIC. A GaN MMIC device provides high power density and bandwidth, and a spatial power-combining device may combine power from a plurality of GaN MMICs efficiently in a single step to minimize combining loss.

In operation, an input signal 54 is propagated from the input port 12 to the input coaxial waveguide section 14, where it radiates between the inner conductor 18 and the outer conductor 20 and concurrently provides the input signal 54 to the center waveguide section 16. The input antenna structures 48 of the plurality of amplifier assemblies 22 collectively form an input antenna array 56. The input antenna array 56 couples the input signal 54 from the input coaxial waveguide section 14, distributing the input signal 54 substantially evenly to each one of the amplifier assemblies 22. Each input antenna structure 48 receives a signal portion of the input signal 54 and communicates the signal portion to the amplifier 52. The amplifier 52 amplifies the signal portion of the input signal 54 to generate an amplified signal portion that is then transmitted from the amplifier 52 to the output antenna structure 50. The output antenna structures 50 collectively form an output antenna array 62 that operates to provide the amplified signal portions to be concurrently combined inside the opening of the output coaxial waveguide section 32 to form an amplified output signal $54_{AMP}$, which is then propagated through the output coaxial waveguide section 32 to the output port 34.

Figure 2:
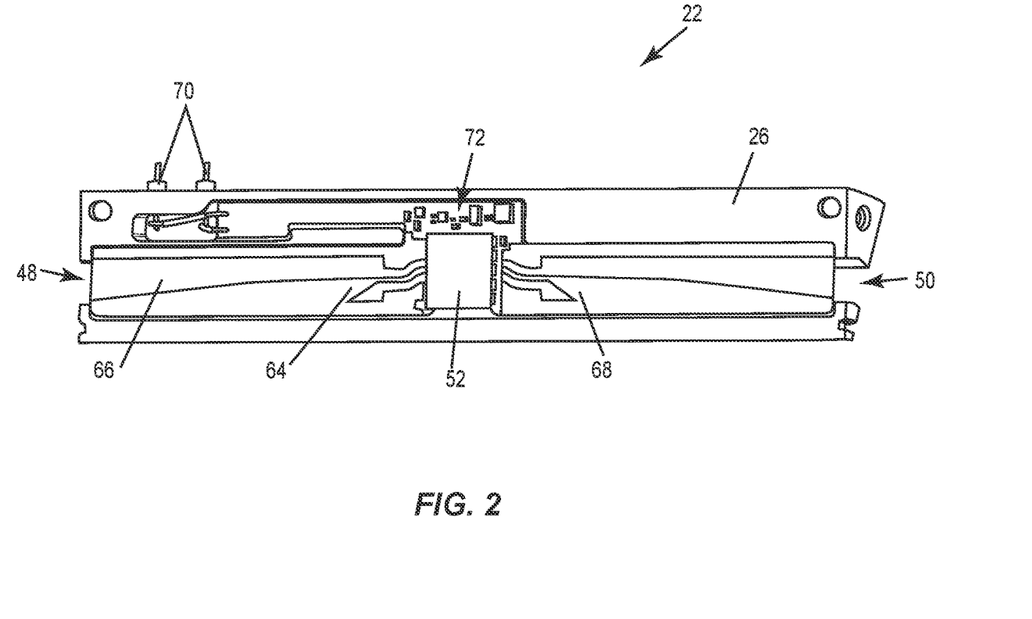
FIG. 2 is a perspective view of an individual amplifier assembly of the spatial power-combining device of FIG. 1.

FIG. 2 is a perspective view of an individual amplifier assembly 22 of FIG. 1 according to embodiments disclosed herein. The input antenna structure 48 comprises an input signal conductor 64 supported on a first face of a substrate 66 or board, and the output antenna structure 50 comprises an output signal conductor 68 that is also supported on the first face of the substrate 66. The input signal conductor 64 and the output signal conductor 68 are electromagnetically coupled to the amplifier 52. The substrate 66 may be a printed circuit board that provides a desired form factor and mechanical support for the input signal conductor 64 and the output signal conductor 68. The input antenna structure 48 also includes an input ground conductor (not visible) on an opposing second face of the substrate 66 to the input signal conductor 64. In a similar manner, the output antenna structure 50 includes an output ground conductor (not visible) on the opposing second face of the substrate 66 to the output signal conductor 68. In other embodiments, the substrate 66 may be substituted with a plurality of substrates or boards. In still other embodiments, the input signal conductor 64, the input ground conductor (not visible), the output signal conductor 68, and the output ground conductor (not visible) are mechanically supported by the body structure 26 such that the substrate 66 may not be present. In certain embodiments, one or more ports 70 are provided for an external voltage input, such as from a direct current voltage source, and corresponding bias circuitry 72 is provided to control the amplifier 52. In certain embodiments, the bias circuitry 72 is arranged on the same substrate 66 as the antenna structures 48, 50. In other embodiments, a separate substrate may be provided for the bias circuitry 72.

In operation, a portion of the input signal (54 in FIG. 1) is received by the input antenna structure 48 where it radiates between the input signal conductor 64 and the input ground conductor (not visible) and propagates to the amplifier 52 for amplification. For embodiments with a board 66, the portion of the input signal (54 in FIG. 1) radiates between the input signal conductor 64 and the input ground conductor (not visible) through the board 66. For embodiments without a board 66, the portion of the input signal (54 in FIG. 1) radiates between the input signal conductor 64 and the input ground conductor (not visible) through air. The amplifier 52 outputs a portion of the amplified signal ($54_{AMP}$ in FIG. 1) to the output antenna structure 50 where it radiates between the output signal conductor 68 and the output ground conductor (not visible) in a similar manner.

Turning back to FIG. 1, the spatial power-combining device 10 is typically utilized for high power-combining applications. Accordingly, the amplifier 52 in each of the amplifier assemblies 22 is configured for high power amplification, and may therefore generate a high amount of heat. If the operating temperature of each amplifier 52 increases too much, the performance and lifetime of each amplifier 52 may suffer. As previously described, the plurality of amplifier assemblies 22 form the center waveguide section 16. In this regard, thermal management is needed to effectively dissipate heat in and around the center waveguide section 16. Accordingly, the body structure 26 of each amplifier assembly 22 may typically comprise a thermally conductive material, such as copper (Cu), aluminum (Al), or alloys thereof that are configured to dissipate enough heat from the amplifier 52 to maintain a suitably low operating temperature. In certain applications, the body structure 26 may comprise graphite with an electrically conductive film, such as nickel (Ni), Cu, or combinations thereof.

Figure 3:
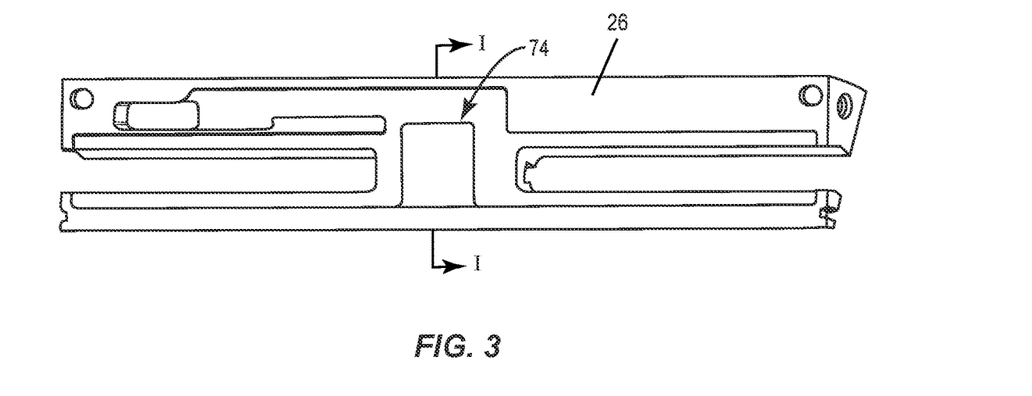
FIG. 3 is a perspective view of a body structure of the amplifier assembly of FIG. 2 with the antenna structures, the amplifier, the ports, and the bias circuitry of FIG. 2 omitted for illustrative purposes.

FIG. 3 is a perspective view of the body structure 26 of FIG. 2 with the antenna structures 48, 50, the amplifier 52, the ports 70, and the bias circuitry 72 of FIG. 2 omitted for illustrative purposes. The body structure 26 includes a surface 74 on which an amplifier will be mounted or otherwise arranged. As previously described, during operation, amplifiers generate heat within amplifier assemblies of spatial power-combining devices. In this manner, the surface 74 is arranged in closest proximity to a heat generating amplifier after assembly.

According to aspects disclosed herein, body structures of amplifier assemblies for spatial power-combining devices may include one or more heat sinks that are partially or fully embedded within the body structures. The heat sinks may be arranged in proximity to heat-generating amplifiers to provide effective heat dissipation paths away from such amplifiers. In certain embodiments, the heat sinks are formed with a higher thermal conductivity than a material that forms the body structures. In certain embodiments, the heat sinks may comprise single-phase heat sinks and/or two-phase heat sinks. In certain embodiments, heat sinks may comprise one or more of a solid metal, ceramic, graphite, or polymer materials and combinations thereof. For example, an exemplary amplifier assembly may comprise a copper or graphite heat sink that is embedded within an aluminum body structure. In certain embodiments, heat sinks may comprise pre-fabricated complex objects such heat pipes, thermal ground planes (TGP), and phase change materials such as paraffin wax.

In order to either partially or fully embed such heat sinks within heat transfer devices and/or body structures of amplifier assemblies, additive manufacturing techniques such as three-dimensional (3-D) printing may be employed. Additive manufacturing may include forming structures in a layer-by-layer manner using source materials of powders, wires, and/or sheets of materials. For example, a structure may be formed by employing focused energy such as an electron beam or a laser beam to selectively melt and/or sinter powder to progressively form the structure. A structure formed by additive manufacturing typically includes unique properties due to the progressive nature of the process. For example, the microstructure of metals formed by additive manufacturing have unique structures compared with conventionally formed metals. In particular, columnar grain structures may predominately form with high quantities of grain orientation. With subsequent heating and cooling cycles, some axial variation of grain structures and material phases may also occur. In this regard, a heat transfer device may be formed by progressively forming a carrier, substrate, or body structure around one or more heat sinks. For spatial power-combining devices, a body structure may be progressively formed around a heat sink, thereby providing an amplifier assembly with an embedded heat sink. As such, a body structure that is formed by additive manufacturing comprises a particular structure that may not be achievable by conventional techniques such as machining, forging, and casting. In particular, the body structure may be formed with a seamless structure around the heat sink as opposed to conventional techniques that may join different halves together, thereby introducing seams that can provide mechanical and electrical failure points for an assembled spatial power-combining device. Accordingly, the body structure formed by additive manufacturing may comprise a unitary structure around the heat sink. Additionally, the heat sinks may be provided without mechanically removing portions of a body structure, such as drilling into the body structure to form one or more thermal vias.

Figure 4:
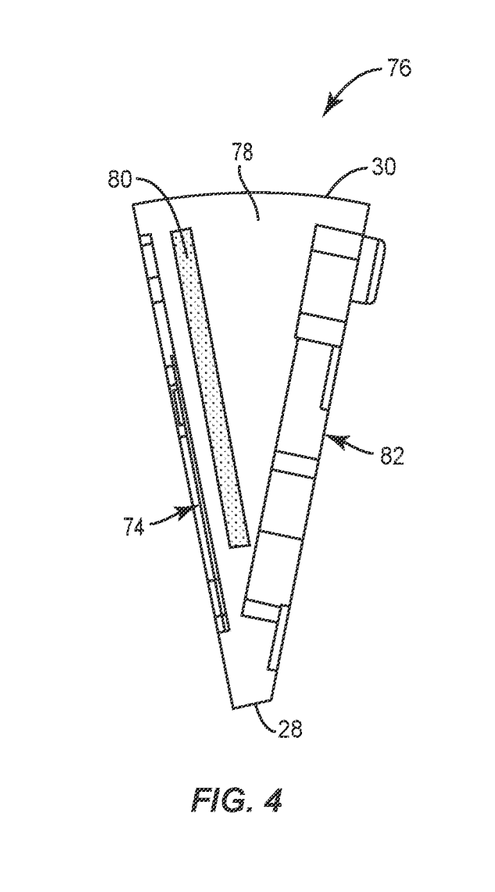
FIG. 4 represents a cross-section of an amplifier assembly that includes a body structure that is similar to the body structure of FIG. 3 taken along the section line I-I, where the body structure of FIG. 4 further includes an embedded heat sink.

FIG. 4 represents a cross-section of an amplifier assembly 76 that includes a body structure 78 that is similar to the body structure 26 taken along the section line I-I of FIG. 3, where the body structure 78 further includes an embedded heat sink 80. In FIG. 4, the heat sink 80 is entirely embedded within the body structure 78 such that no portions of the heat sink 80 are exposed outside of the body structure 78. The heat sink 80 may be provided within the body structure 78 in a location that is closer to the surface 74 on which an amplifier will be mounted than an opposing surface 82 that will be arranged closer to an amplifier of an adjacent amplifier assembly in a fully assembled spatial power-combining device. In certain embodiments, the heat sink 80 may extend farther in a longitudinal direction from the inner surface 28 to the outer surface 30 of the body structure 78, rather than across the body structure 78. In this manner, the heat sink 80 may provide a heat path that effectively dissipates heat in a direction that is lateral to the surface 74 on which an amplifier is mounted. In certain embodiments, the heat sink 80 may extend within the body structure 78 in lateral directions that are greater than one or more peripheral edges of an amplifier mounted on the surface 74. As previously described, the heat sink 80 may comprise one or more of thermally conductive materials or elements including a solid metal, a ceramic material, a graphite material, a polymer material, and pre-fabricated complex objects such heat pipes, TGPs, and phase change materials. While a single heat sink 80 is illustrated, the amplifier assembly 76 may comprise a plurality of heat sinks 80 that are entirely embedded within the body structure 86.

Figure 5:
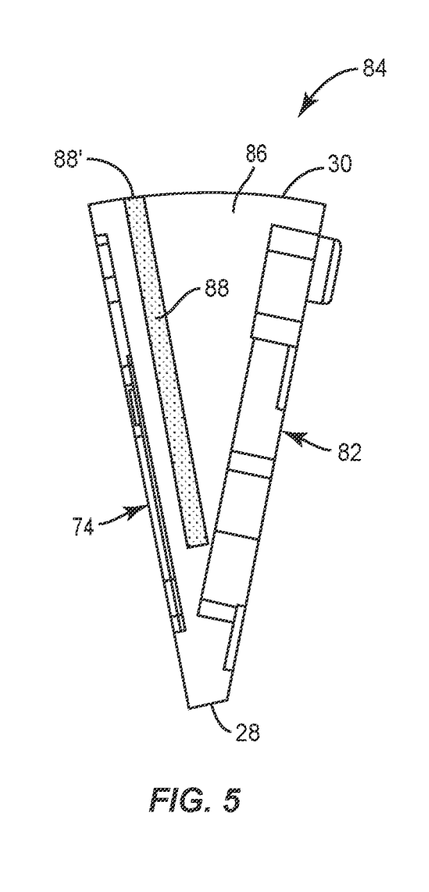
FIG. 5 represents a cross-section of an amplifier assembly that includes a body structure that is similar to the body structure of FIG. 4, but includes a partially embedded heat sink.

FIG. 5 represents a cross-section of an amplifier assembly 84 that includes a body structure 86 that is similar to the body structure 78 of FIG. 4, but includes a partially embedded heat sink 88. In FIG. 5, a peripheral edge 88' of the heat sink 88 is exposed at the outer surface 30 of the body structure 86. In this manner, heat from an amplifier mounted on the surface 74 may dissipate along a lateral path that extends to the peripheral edge 88' and outside of the body structure 86. In certain embodiments, an external heat transfer device may be provided proximate to the outer surface 30 of the amplifier assembly 84. For example, when a plurality of the amplifier assemblies 84 are radially arranged to form a center waveguide section (16 of FIG. 1), an external heat transfer device may be formed around the center waveguide section proximate to the outer surface 30 of each amplifier assembly 84. In this regard, the heat sink 88 may be thermally coupled to the external heat transfer device without portions of the body structure 86 being provided between the outer surface 30 and the heat sink 88. In further embodiments, one or more portions of the heat sink 88 may be exposed at other surfaces of the body structure 86. For example, a portion of the heat sink 88 may be exposed at the surface 74 on which an amplifier is mounted. In this regard, an amplifier may be mounted to the heat sink 88 without portions of the body structure 86 being provided between the amplifier and the heat sink 88, thereby forming a heat dissipation path from the amplifier to the heat sink 88 that is devoid of any portion of the body structure 86. While the heat sink 88 (and the heat sink 80 of FIG. 4) is illustrated with a cross-sectional shape that forms generally parallel opposing faces within the body structure 86, other shapes are possible. The heat sink 88 may comprise any of the materials described above for the heat sink 80 of FIG. 4. Additionally, while a single heat sink 88 is illustrated, the amplifier assembly 84 may comprise a plurality of heat sinks 88 that are partially embedded within the body structure 86.

Figure 6:
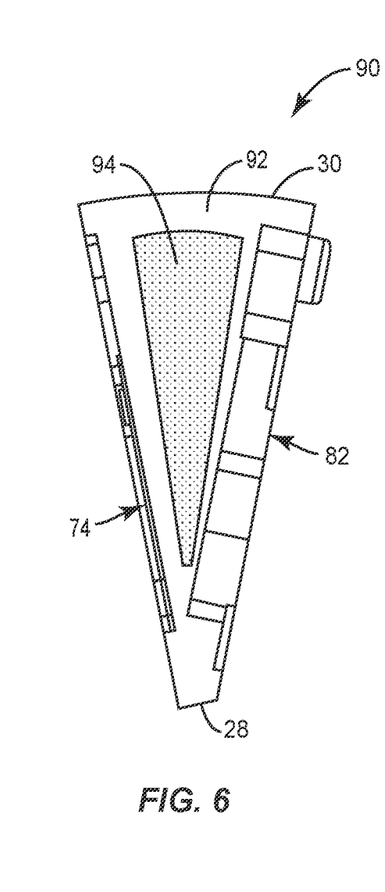
FIG. 6 represents a cross-section of an amplifier assembly that includes a body structure that is similar to the body structure of FIG. 4, but includes a heat sink that forms a cross-sectional shape that corresponds to a cross-sectional shape of the amplifier assembly.

FIG. 6 represents a cross-section of an amplifier assembly 90 that includes a body structure 92 that is similar to the body structure 78 of FIG. 4, but includes a heat sink 94 that forms a cross-sectional shape that corresponds to a cross-sectional shape of the amplifier assembly 90. As previously described, the amplifier assembly 90 may form a cross-sectional wedge shape for radial assembly within a spatial power-combining device. In FIG. 6, the heat sink 94 also forms a cross-sectional wedge shape. In this regard, the heat sink 94 may be formed with increased volume within the body structure 92 to provide further heat dissipation capabilities. While the heat sink 94 is illustrated as entirely embedded within the body structure 92, the heat sink 94 may also be partially embedded in any of the configurations described for the heat sink 88 of FIG. 5. Additionally, the heat sink 94 may comprise any of the materials described above and the amplifier assembly 90 may comprise a plurality of the heat sinks 94 without deviated from the principles disclosed herein.

Figure 7A:
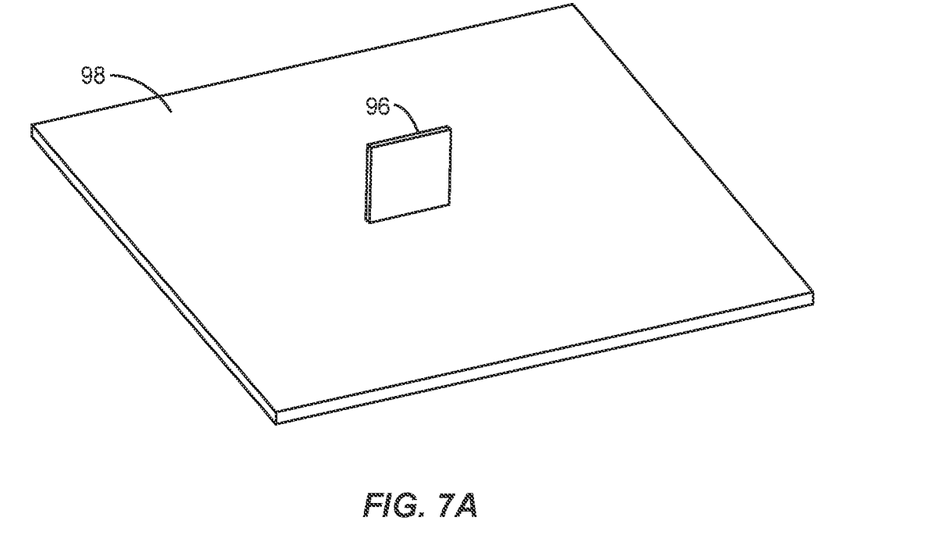
FIGS. 7A-7C illustrated steps for fabricating an amplifier assembly with an embedded heat sink according to additive manufacturing steps as disclosed herein.
Figure 7B:
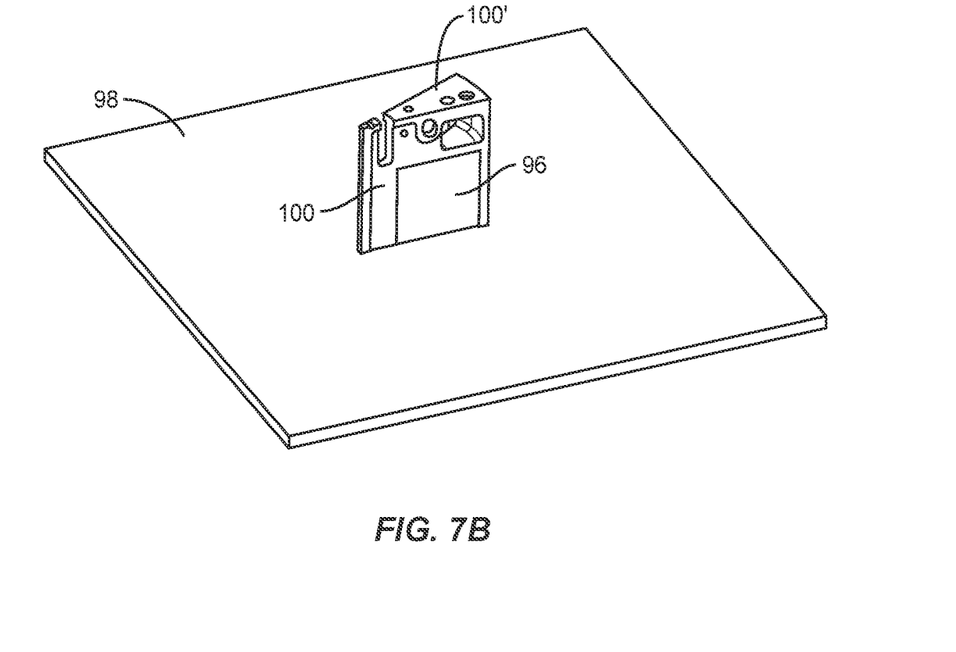
Figure 7C:
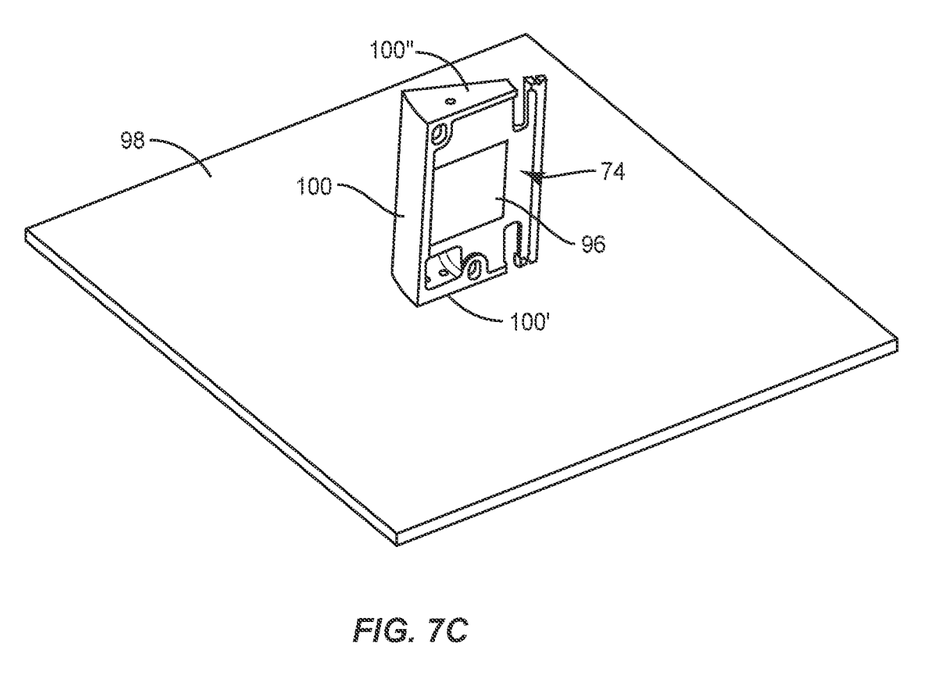

FIGS. 7A-7C illustrated steps for fabricating an amplifier assembly with an embedded heat sink according to additive manufacturing steps as disclosed herein. In FIG. 7A, a heat sink 96 is provided on a support surface 98 or table. The heat sink 96 may comprise any of the previously described thermally conductive materials or elements, including metal materials, ceramic materials, graphite materials, polymer materials, and pre-fabricated complex objects such heat pipes, TGPs, and phase change materials.

In FIG. 7B, a portion of a body structure 100 is formed around the heat sink 96 by additive manufacturing. As previously described, the body structure 100 may comprise a thermally conductive metal such as Cu, Al, or alloys thereof. In this regard, a metal additive manufacturing process such as direct metal laser sintering (DMLS) may be employed. As such, the body structure 100 may be formed by laser sintering fine metal powders to progressively build up the body structure 100 from the support surface 98. In FIG. 7B, the body structure 100 is partially formed around the heat sink 96 until a first end 100' of the body structure 100 is completed opposite the support surface 98. As illustrated in FIG. 7C, the body structure 100 and the heat sink 96 may then be separated from the support surface 98 and subsequently flipped over to place the first end 100' on the support surface 98. The remainder of the body structure 100 may then be formed by additive manufacturing until a second end 100" of the body structure that is opposite the first end 100' is fully formed. After completion, the body structure 100 with the embedded heat sink 96 may be removed from the table to form an amplifier assembly as previously described.

In FIG. 7C, the heat sink 96 is illustrated as partially embedded in the body structure 100 such that a portion of the heat sink 96 is exposed at the surface 74 of the body structure 100 where an amplifier will be mounted. In certain embodiments, lateral dimensions of the exposed portion of the heat sink 96 relative to the surface 74 are arranged at least the same as lateral dimensions of an amplifier that will be mounted to promote improved thermal coupling. In further embodiments, lateral dimensions of the exposed portion of the heat sink 96 may extend past peripheral edges of an amplifier that will be mounted. While the heat sink 96 is illustrated as partially embedded, the heat sink 96 may alternatively be entirely embedded within the body structure as previously described. By forming the body structure 100 by additive manufacturing, the heat sink 96 may comprise large and/or complex shapes and structures embedded within the body structure 100. In certain embodiments, the additive manufacturing of the body structure 100 may include other additive manufacturing techniques, such as selective laser melting (SLM), laser cladding, laser metal deposition, and electron beam melting.

Figure 8A:
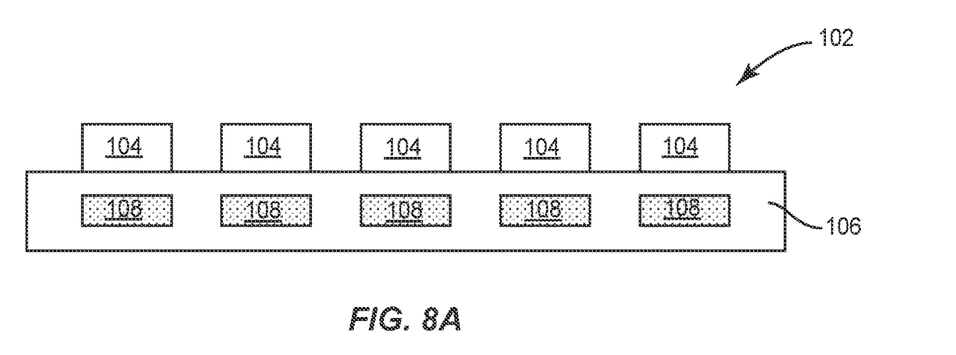
FIGS. 8A and 8B are cross-sectional illustrations of a planar power amplifier device that includes one or more amplifiers mounted on a substrate that includes one or more embedded heatsinks.
Figure 8B:
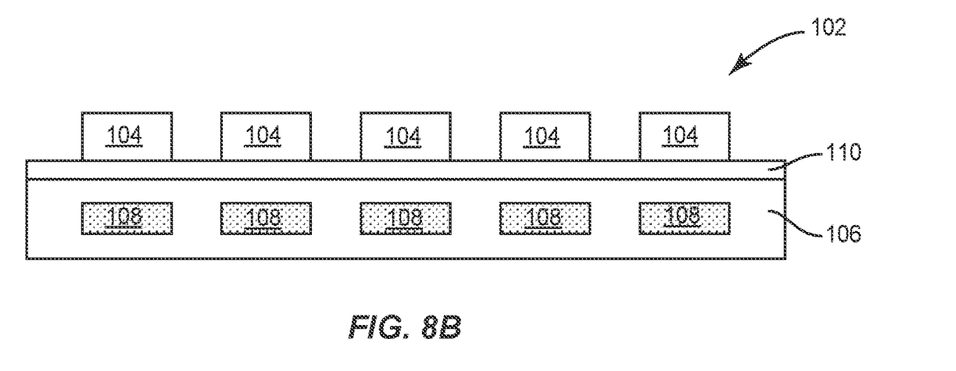

While the above described embodiments are related to spatial power-combining devices, aspects described herein are applicable to other heat transfer devices and structures. FIG. 8A is a cross-sectional illustration of a planar power amplifier device 102 that includes one or more amplifiers 104 mounted on a planar thermal structure 106 that includes one or more embedded heatsinks 108. The planar thermal structure 106 may comprise a substrate, a carrier, or the like that is configured to support the one or more amplifiers 104. In certain embodiments, the power amplifier device 102 comprises a solid state power amplifier (SSPA) device. As illustrated, the amplifiers 104 may be mounted on the planar thermal structure 106 in positions that are registered with the heatsinks 108. In certain embodiments, the planar thermal structure 106 may be formed around the heatsinks 108 by additive manufacturing techniques as described above such that the heat sinks 108 may be partially or fully embedded within the planar thermal structure 106. For such applications, the planar thermal structure 106 may comprise a solid material formed by additive manufacturing, and the heatsinks 108 may comprise solid materials or pre-fabricated complex objects such as heat pipes, TGPs, and phase change materials. In certain embodiments, the planar thermal structure 106 with embedded heatsinks 108 may be provided to replace one or more conventional cold plates in planar applications. For such embodiments, the planar thermal structure 106 may form an improved or hybrid cold plate with embedded heatsinks 108. For example, the planar thermal structure 106 may be formed by additive manufacturing to include one or more fluid channels in regions separate from the embedded heatsinks 108. The fluid channels may form conduits for flow of cooling liquids, gels, and/or gases that, in combination with the heatsinks 108, provide improved heat transfer for the power amplifier device 102. As illustrated in FIG. 8B, the power amplifier device 102 may further comprise at least one additional layer 110 formed between the amplifiers 104 and the planar thermal structure 106. The additional layer 110 may comprise electrical traces for the amplifiers 104, a printed circuit board, and one or more dielectric materials. In certain embodiments, the at least one additional layer 110 may comprise an additional heat sink including a cold plate, among others, that promotes additional thermal dissipation in combination with the planar thermal structure 106 with embedded heatsinks 108.

Figure 9A:
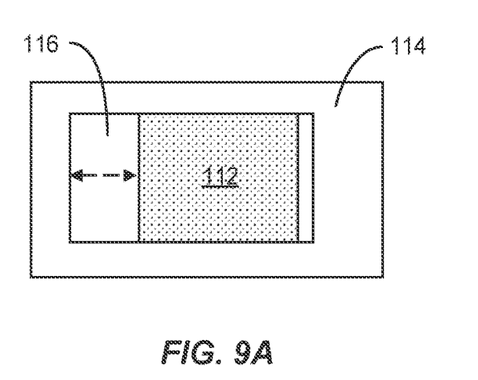
FIGS. 9A and 9B are cross-sectional views of exemplary structures where a first object is embedded and movable within a second object that is formed by additive manufacturing.
Figure 9B:
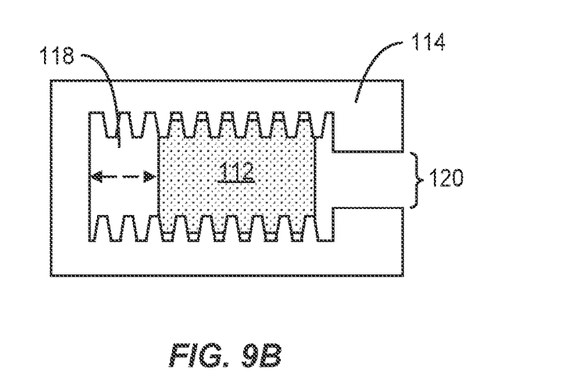

As described herein, additive manufacturing techniques are described that either partially or fully embed one object within another object. Such additive manufacturing techniques may be applicable to form metal materials around one or more embedded objects. Additionally, the embedded objects may also comprise metal materials, other thermally conductive materials, and/or complex pre-fabricated objects as described above. In certain embodiments, the embedded object may be formed to be movable within the other object. For example, FIGS. 9A and 9B are cross-sectional views of exemplary structures where a first object 112 is embedded and movable within a second object 114. In FIG. 9A, the second object 114 may be formed in a unitary manner by additive manufacturing around the first object 112 such that a cavity 116 or opening is formed around the first object 112. The cavity 116 may be formed with a relative size that is larger in at least one dimension than the first object 112. In this regard, a position of the first object 112 within the second object 114 may be adjustable in at least one direction as indicated by the dashed-line arrow within the cavity 116. In FIG. 9B, the first object 112 and the second object 114 may form more complex shapes. As illustrated, the first object 112 may form a threaded insert such as a screw or a bolt that is embedded within the second object 114. As such, the second object 114 may be formed by additive manufacturing and may further include a corresponding threaded cavity 118. As illustrated, the first object 112 may be accessible through an opening 120 formed in the second object 114. In this manner, a position of the first object 112 may be moved within the second object 114 as indicated by the dashed-line arrow within the threaded cavity 118. In certain embodiments, the first object 112 may comprise a heat sink as described above and the second object 114 may comprise a body structure as described above. The ability to re-position a heat sink within a body structure may be beneficial for tuning, adjusting, and/or optimizing heat dissipation paths within power amplifier structures.

In certain embodiments, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A solid state power amplifier (SSPA) device comprising: one or more amplifiers; and a planar thermal structure on which the one or more amplifiers are mounted, the planar thermal structure comprising one or more embedded heatsinks that are registered with the one or more amplifiers, the one or more embedded heatsinks comprising a solid material that is surrounded by the planar thermal structure.

2. The SSPA device of claim 1, wherein the SSPA device is a planar power amplifier device.

3. The SSPA device of claim 1, further comprising an additional layer between the one or more amplifiers and the planar thermal structure.

4. The SSPA device of claim 3, wherein the additional layer comprises a printed circuit board.

5. The SSPA device of claim 3, wherein the additional layer comprises an additional heat sink that is on the planar thermal structure.

6. The SSPA device of claim 1, wherein the one or more amplifiers comprise one or more monolithic microwave integrated circuit (MMIC) amplifiers.

7. The SSPA device of claim 6, wherein the one or more MMICs comprise gallium nitride (GaN)-based MMICs.

8. The SSPA device of claim 1, wherein:
the one or more amplifiers comprises a plurality of amplifiers;
the one or more embedded heatsinks comprise a plurality of embedded heatsinks; and
a separate embedded heatsink of the plurality of embedded heatsinks is registered with each amplifier of the plurality of amplifiers.

9. The SSPA device of claim 1, wherein the planar thermal structure is formed by additive manufacturing around the one or more embedded heatsinks.

10. The SSPA device of claim 1, wherein the one or more embedded heatsinks are movable within the planar thermal structure.

11. A solid state power amplifier (SSPA) device comprising:
one or more amplifiers; and
a thermal structure on which the one or more amplifiers are mounted, the thermal structure comprising one or more embedded heatsinks that are registered with the one or more amplifiers, the one or more embedded heatsinks comprising a solid material that is movable within the thermal structure.

12. The SSPA device of claim 11, wherein:
the one or more amplifiers comprise a plurality of amplifiers;
the one or more embedded heatsinks comprise a plurality of embedded heatsinks; and
a separate embedded heatsink of the plurality of embedded heatsinks is registered with each amplifier of the plurality of amplifiers.

13. The SSPA of claim 11, wherein the SSPA device is a planar power amplifier device.

14. The SSPA of claim 11, wherein the one or more embedded heatsinks are movable within a cavity formed within the thermal structure.

15. The SSPA of claim 14, wherein the one or more embedded heatsinks comprise a threaded insert that is movable within the cavity.

16. The SSPA of claim 15, wherein the threaded insert is accessible through an opening formed in the thermal structure.

17. The SSPA device of claim 11, further comprising an additional layer between the one or more amplifiers and the thermal structure.

18. The SSPA device of claim 17, wherein the additional layer comprises a printed circuit board.

19. The SSPA device of claim 17, wherein the additional layer comprises an additional heat sink that is on the thermal structure.

20. The SSPA device of claim 11, wherein the one or more amplifiers comprise gallium nitride (GaN)-based monolithic microwave integrated circuit (MMIC) amplifiers.

* * * * *